United States Patent [19]

Solina

[11] Patent Number: 4,807,260
[45] Date of Patent: Feb. 21, 1989

[54] NON HIGH FREQUENCY CLOCK DEPENDENT MANCHESTER BIPHASIC DECODER AND COMPARATOR

[75] Inventor: Rodney M. Solina, Orange, Calif.

[73] Assignee: Northrop Corporation, Hawthorne, Calif.

[21] Appl. No.: 105,069

[22] Filed: Oct. 5, 1987

[51] Int. Cl.$^4$ ............................................. H04L 7/02
[52] U.S. Cl. ..................................... 375/110; 375/55; 375/87; 375/94; 371/55
[58] Field of Search ............... 375/108, 110, 114, 116, 375/55, 87, 94; 371/55

[56] References Cited

U.S. PATENT DOCUMENTS 3,659,286 4/1972 Perkins et al. ............... 375/55 X
4,661,965 4/1987 Maru ................................ 375/87 X Primary Examiner—A. D. Pellinen
Assistant Examiner—Derek S. Jennings
Attorney, Agent, or Firm—Terry J. Anderson; Robert B. Block

[57] ABSTRACT

A decoder and comparator for Manchester biphase code utilizes a clock recovery logic to recover clock signals directly from the code and thus bypasses the necessity of an external clock. This recovered clock is utilized to input the code into shift registers. Further, a frame sync recovery logic analyzes the code with respect to correspondence of a proper Manchester code format. An encoder is utilized to encode first and second comparators. The first comparator is encoded with error codes for the Manchester code. If the proper Manchester code is present as determined by the frame sync recovery logic and the proper error codes are present, a frame or word of code is output from the shift registers to a first holding latch. If proper Manchester code is present and if a second set of error perameters are met as for instance perameters with respect to either data or address, the frame or word held in the first latch is output to a second latch and from there to an output bus for use by some other device.

27 Claims, 5 Drawing Sheets

NON HIGH FREQUENCY CLOCK DEPENDENT MANCHESTER BIPHASIC DECODER AND COMPARATOR

CONTRACTUAL ORIGIN OF THE INVENTION

The United States government has rights in this invention pursuant to contract Number N00030-84-C-0100.

BACKGROUND OF INVENTION

This invention is directed to a decoder and comparator for Manchester biphasic code which does not require the use of a high frequency clock for the decoder comparator.

Manchester code is utilized for data transmission. It utilizes a mid bit phase transition to be indicative of a binary 1 bit or a binary 0 bit. U.S. Pat. No. 4,361,895 discussed certain advantages and disadvantages of Manchester code and discloses a decoder for Manchester code. This decoder, however, relies upon the use of a local clock during the decoding of the data.

U.S. Pat. No. 4,545,055 further discusses the use of Manchester or biphase code. It discusses certain military standards utilized in this code, most notably MIL-STD-1553. As with the decoder of the patent noted in the prior paragraph, the decoder of this patent also requires the use of a local clock for decoding.

In order to avoid the necessity of having to use a clock for decoding purposes, U.S. Pat. Nos. 3,979,746, 3,659,286, 3,967,061, and 4,507,794 disclose devices for recovering a clock pulse from the Manchester data itself. While the devices presented in these patents certainly all have utilitarian value, none of them provide for simultaneously also recognizing certain frame sequences within the code, such as a frame sync as per the above 1553 protocol noted in U.S. Pat. No. 4,545,055. Further, the slow speed of IC's and other devices which certain of these patents utilize inherently inhibits the self-clocking features of the patents. Thus, for instance the use of MOS elements or RC networks and the like can inherently limit the usefulness of the devices at particular frequencies.

BRIEF DESCRIPTION OF THE INVENTION

It is broad object of this invention to provide for new and improved devices for decoding and comparing Manchester biphasic Code. It is a further object of this invention to provide for a device which is self clocking. Additionally it is an object of this invention to provide a device which is capable of recognizing certain indicators within the frames of the code which are being decoded and compared.

These and other objects as will be evident from the remainder of this specification are achieved in a decoder and comparator for a biphase code which includes certain circuit elements for receiving a stream of a code and temporarily storing a frame of the code. Further, it includes a clock recovery logic for receiving a stream of the code and recovering clock pulses from the code with the clock pulses then output to the code storage elements for loading a frame of the code into the storage elements. Additionally, it includes a code frame recovery logic for receiving a stream of the code and recognizing a frame indicator in the code and in response to the frame indicator outputting at least one strobe signal to the code storage elements for outputting a stored frame of code from said code storage elements.

The code storage elements can include at least two frame latches wherein a frame of code can be sequentially stored. Further, by incorporating error comparing elements, a stored frame of code can be analyzed as to its compliance with certain preselected parameters. The code can be propagated to the code storage elements by strobing utilizing a strobe signal from the code frame recovery logic. This can be combined with the error compared circuitry to only propagate a frame of code through the code storage elements when the code meets the parameters of both the code frame recovery logic and the error compare elements.

The clock signal recovery logic advantageously will detect transitions in a data stream of code between high and low signal levels. Further, a clock delay reset logic will reset the clock recovery logic in response to a delay of signal propagation and a clock pulse width logic will set the pulse width of an outputted train of clock pulses.

The frame sync recovery logic includes logic for generating signals in response to code input which are coupled with further logic for delaying at least one of said generated signals and logic for detecting a center transition signal. A strobe generating logic will then be utilized to generate a strobe signal in response to at least detection of the center signal transition.

DETAILED DESCRIPTION OF THE DRAWINGS

This invention will be better understood when taken in conjunction with the drawings wherein.

Figure 3A:
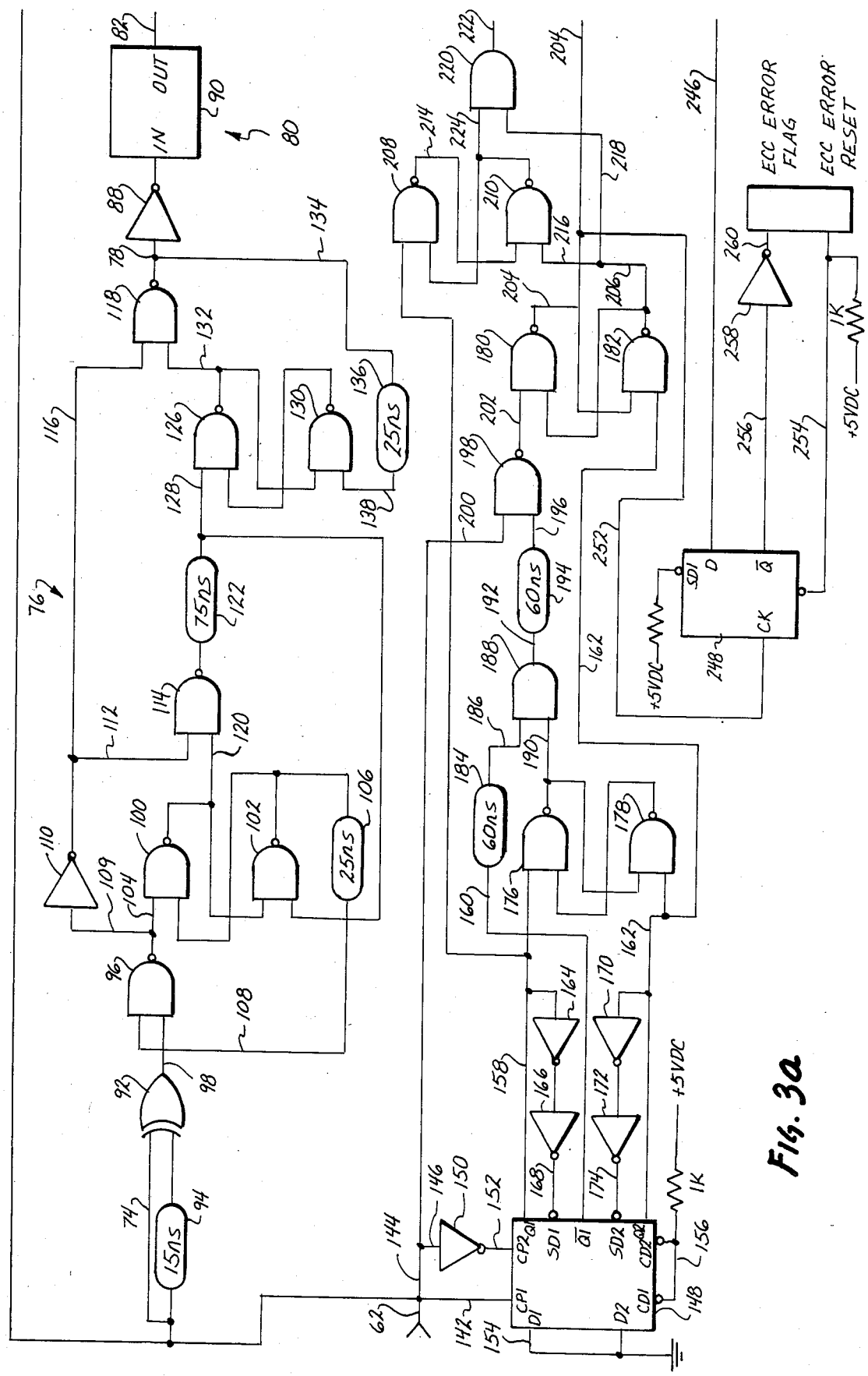

FIGS. 3a,b,c are circuit schematics of the invention.

This invention utilizes certain principles and/or concepts as are set forth in the claims appended hereto. Those skilled in the electronic arts will realize that these principles and/or concepts are capable of being utilized in a variety of embodiments. For this reason this invention is not to be construed as being limited solely to the illustrated embodiment, but should only be construed in view of the claims appended hereto.

DETAILED DESCRIPTION

Many prior Manchester decoders utilized clocks in order to decode the Manchester data. Typically these clocks functioned at 16 to 32 times the base frequency of the Manchester code. Utilizing the device of this invention 20 mb Manchester II biphase code can be decoded and compared with certain pre-established parameters without the use of a high frequency clock. Thus, the device of the invention can decode a 20 bit serial Manchester II biphase code at a typical 10 MHz clock rate without the normally required high frequency ($\times 16$) decode clock. The bit content of each word or frame of code received can be compared against certain preset parameters for detection of errors in the code, addresses in the code or certain predefined data bits.

The above referred to MIL-STD-1553 code format utilizes a 20 bit word or frame which includes a frame sync incorporated therein for word or frame identification purposes.

In one use of this "1553" protocol, a frame sync utilizes bits 0, 1 and 2 with bit 3 comprising a start bit. Data is encoded on bit 4 and address is encoded on bits 5 through 13 inclusively. Bits 14 through 19 inclusively are utilized for error checking of the code. By recovering clock pulses directly from this code the use of a high frequency clock is not necessary and therefore operation of certain components of the invention can be at a much reduced clock rate.

For a 20 bit Manchester biphasic code at 10 MHz each bit occupies 100 nano seconds, hereinafter abbreviated as "ns". Within these 100 ns there will be at least one phase transition which is indicative of the content of the bit. Additionally, there may be a further phase transition depending upon the adjacent bits. Two adjacent binary 1's or binary 0's will require two phase transitions within each 100 ns. The mid bit phase transition would be indicative of the binary 1 or the binary 0 with the further phase transition required in order to indicate the next identical bit.

If a binary 1 and a binary 0 are adjacent bits, only the mid bit transition is required. FIG. 2A shows a typical Manchester II biphase word or frame. The frame sync occupies bits 0, 1 and 2. Bit 0 is HIGH as is the first half of bit 1. There is always a phase transition at the middle of bit 1 to LOW. Bit 2 is always LOW. In the code shown, the start bit, bit 3, would always be a binary 1 and thus has a mid bit transition from LOW to HIGH.

For the frame illustrated in FIG. 2A, bit 4 is utilized for a data bit, bits 5 through 13 inclusive as the address bits, and bits 14 through 19 as error bits. For the code shown in FIG. 2A, bit 0 and the first half of bit 1 represent the HIGH portion of the frame sync. Depending upon whether or not bit 19 is a binary 1 or a binary 0, for 10 MHz 20 bit code the signal will stay HIGH for 150 or 200 ns. If bit 19 is a binary 1, a LOW to HIGH transition will occur in mid bit 19 and thus including the last 50 ns of bit 19, for the beginning half of the frame sync a 200 ns HIGH signal is present. If bit 19 is binary 0, a HIGH to LOW transition will occur in mid bit 19 followed by a LOW to HIGH at the beginning of bit 0 such that the beginning half of the frame sync will be 150 ns.

In FIG. 2A bit 4 is shown as a binary 1 and bit 5 is a binary 0. There is a mid bit transition from LOW to HIGH at the middle of bit 4 for the binary 1 with signal then staying HIGH to the middle of bit 5 wherein there is bit transition from HIGH to LOW for binary 0. Since bit 6 is also a binary 0 there is a signal transition from LOW to HIGH between bits 5 and 6 such that there can be a further HIGH to LOW transition in mid bit 6 indictive of the binary 0. Thus, from the beginning of bit 4 to mid bit 4 there is a 50 ns LOW signal and from mid bit 4 to mid bit 5 there is a 100 ns HIGH signal. From mid bit 5 to the beginning to bit 6 there again is a 50 ns LOW signal. Depending upon whether or not there are adjacent equal binary data bits, i.e. adjacent binary 1's or adjacent binary 0's there may be a signal transition every 50 ns or if there are alternate binary 1's and binary 0's there will be a signal transition every 100 ns.

Figure 2:
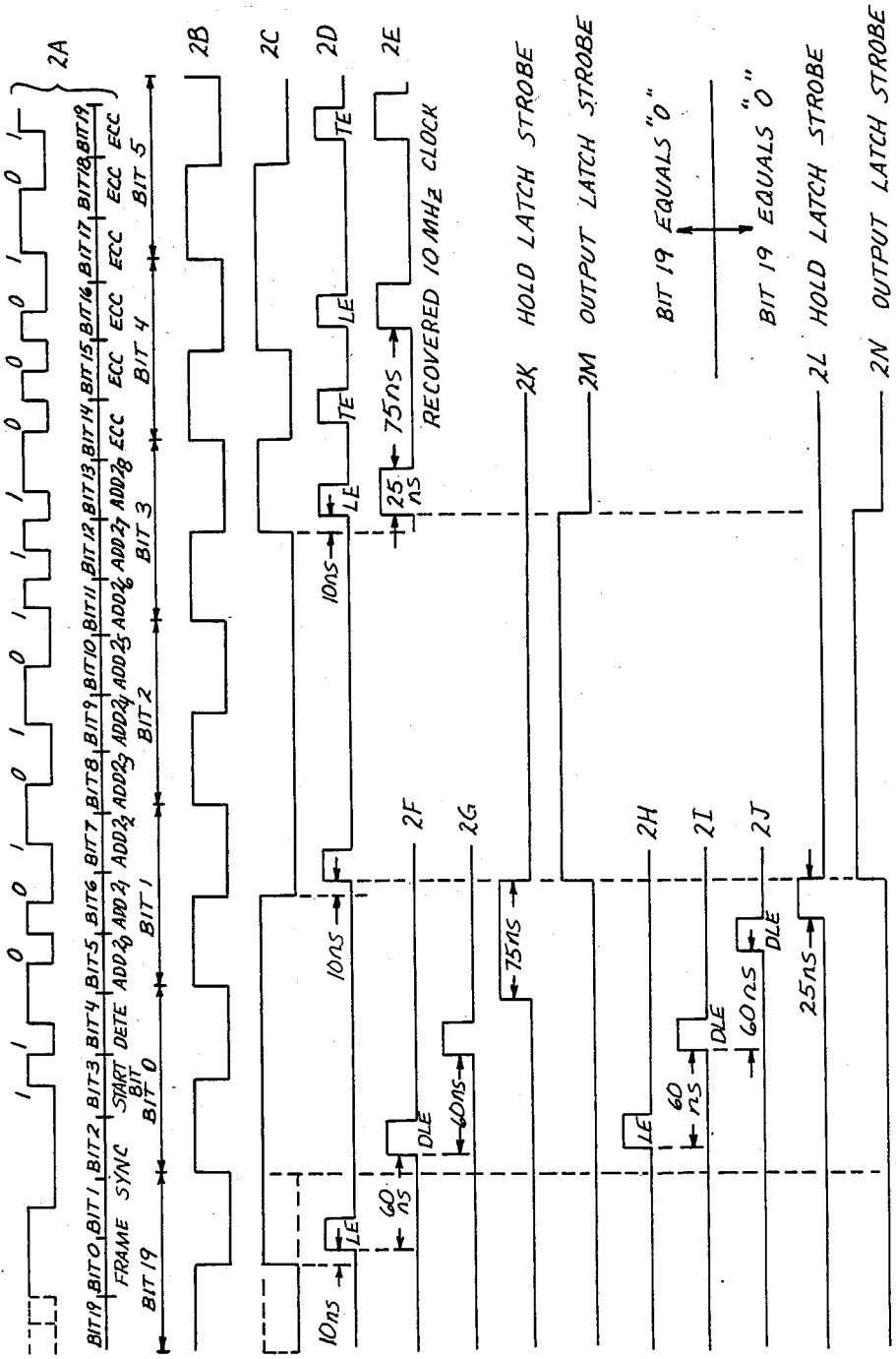
FIG. 2 is a timing diagram illustrating various clocking pulse wave form.

In constructing the signal of FIG. 2A a clock will have been utilized which has a 100 ns frequency. Such a clock is shown in FIG. 2B. In this encoding clock each leading edge represents a LOW to HIGH transition and is followed every 50 ns by a trailing edge representing a HIGH to LOW transition which in turn is followed every 50 ns by a further leading edge. The scale of FIG. 2B is greatly expanded with respect to the scale of FIG. 2A with only certain of the bits centering around the frame sync, i.e. bits 0 through 2 being illustrated in FIG. 2B and the remainder clock signals 2C to 2N of the wave forms shown in FIG. 2.

Figure 1:
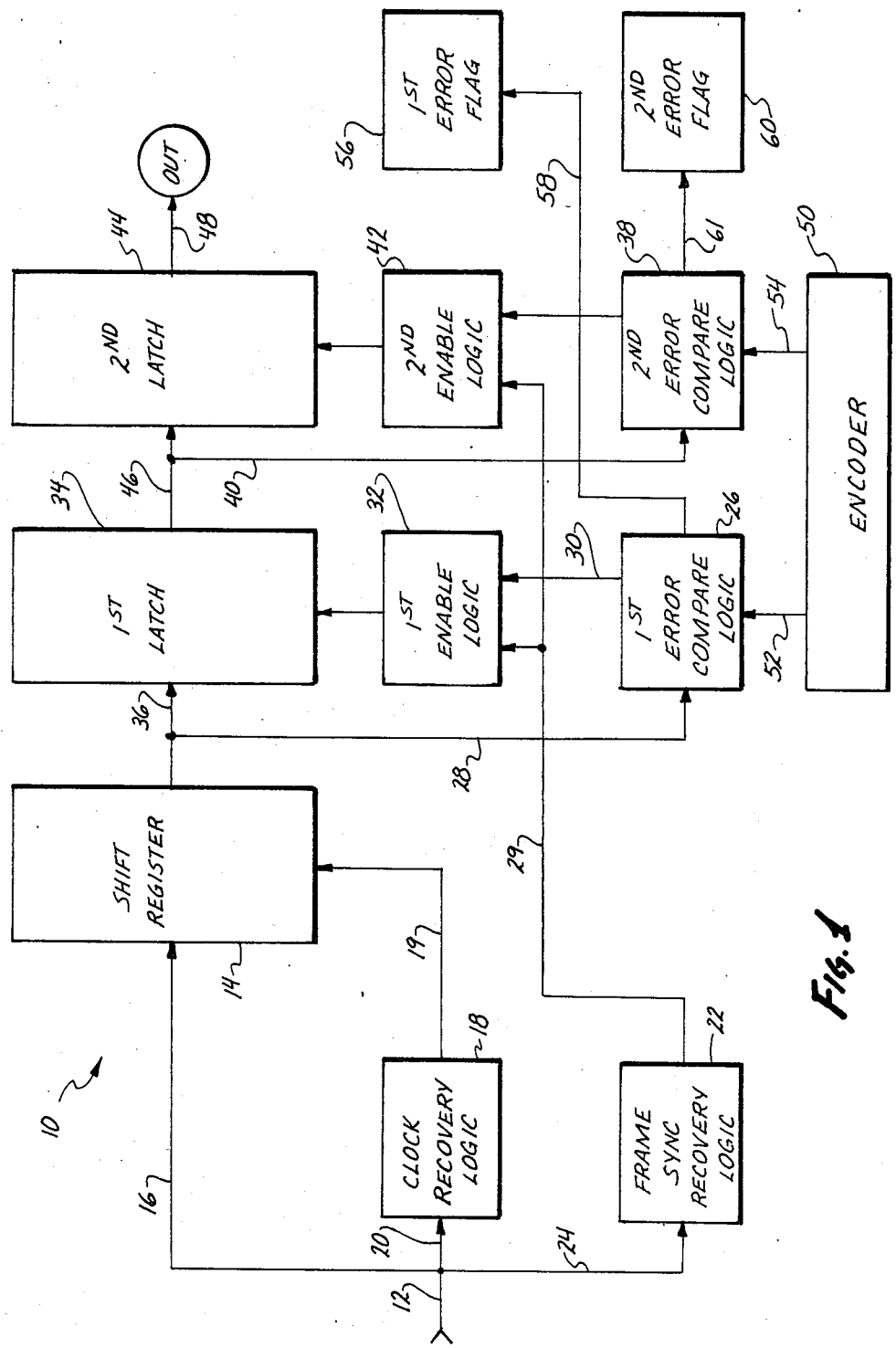
FIG. 1 is a simplified block diagram illustrating the invention.

Referring now to FIG. 1, Manchester biphase code, such as the code of FIG. 2A which has been encoded by an encoding device not forming a part of the invention as a 20 bit code at a 10 MHz clock rate, is input to the decoder comparator 10 of FIG. 2A as a signal on line 12. This signal is independently fed to three devices, a shift register 14 via line 16, a clock recovery logic 18 via line 20 and a frame sync recovery logic 22, via line 24. By independently feeding the Manchester signal to each of the shift register 14, the clock recovery logic 18 and the frame sync recovery logic 22 each of these receives signal unadulterated by any of the other of these three devices.

As hereinafter explained in greater detail, the clock recovery logic 18 recovers the 10 MHz clock from the code input onto line 12 and outputs clock pulse on line 19 to the shift register 14. The device 10 utilizes this information to stepwise store the incoming bits of a frame of code in the shift register 14. The shift register 14 thus constitutes a code receiving means which in turn forms a part of a code storage means.

Concurrently with stepping the code into the shift register 14 by the clock recovery logic 18, the frame sync recovery logic 22 identifies progressive frame syncs in progressive frames of code serially being fed onto the line 12. The shift register 14 is made 16 bits wide whereby it is able to store bits 4 through 19, i.e. the data, the address and the error bits inclusively. The remaining four bits which comprise the frame sync and start bit are not stored in the shift register 14. The frame sync recovery logic utilizes bits 0 to 2 and the start bit, bit 3, is shifted completely through the shift register 14 without utilizing it.

With a frame of code stored in the shift register 14 certain bits of that frame are analyzed with respect to certain preselected parameters. This is done utilizing a first error compare logic 26. The appropriate bits which are being checked by the first error compare logic 26 are fed via bus 28 from the shift register 14 to the first error compare logic 26. If these parameters are met and if simultaneously the frame sync recovery logic 22 has determined by analyzing the frame sync that Manchester code is present, signals are fed to a first enable logic 32 via line 29 from the frame sync recovery logic 22 and via line 30 from the first error compare logic 26. If the sync frame is present as determined by the frame sync recovery logic 22 and if the error parameters checked by the first error compare logic 26 are in compliance with the selected parameters, the first enable logic 32 strobes a first latch 34 with the result being that the 16 bits, i.e. bits 4 to 19, of the frame of data loaded in the shift register 14 are propagated by the bus 36 to the first latch 34.

In a like manner a second set of parameters can be checked against the code frame now loaded in the first latch means 34 by a second error compare logic 38. Thus, the appropriate bits which are being checked against the second set of parameters are fed via bus 40 to the second error compare logic 38. Again, if there is compliance with these parameters and if the frame sync recovery logic 22 has determined that Manchester code is present as determined by the presence of a sync frame, a second enable logic 42 is strobed which enables a second latch 44. Upon strobing latch 44 it becomes transparent and the 16 data, address and error bits which are on the output bus 46 connecting first latch 34 and second latch 44 are propagated to a device output bus 48.

An encoder 50 is utilized to input the respective parameters to the first error compare logic 26 and second error compare logic 38 via buses 52 and 54. A first error flag indicator 56 receives an appropriate strobe signal via line 58 from the first error compare logic 26 for output of a signal indicative of noncompliance with the first set of parameters and a second error flag indicator 60 receives an appropriate strobe signal via line 61 from the second error compare logic 38 for output of a signal indicative of noncompliance with a second set of parameters. In one utilization of the invention, the first error compare logic 26 would check certain bits located in the shift register 14 with respect to their compliance to code format and the second error compare logic 38 would check other bits located in the first latch means 34 with respect to their compliance to either data or address parameters.

The decoder comparator 10 can be utilized with a variety of devices for error checking code input to these devices. As, for instance, it could be utilized for test stations for testing other devices where an operator could encode via the encoder 50 certain protocols checking both with respect to format errors and address and data errors utilized in conjunction with the device being tested. Further, the decoder comparator device 10 of the invention could be utilized to check incoming code to a further logic device as, for instance, a microprocessor. In place of the error indicators 56 and 60 appropriate interfaces with the microprocessor would be made wherein signals are input into the microprocessor or to peripheral support devices and these in turn allow the microprocessor to either utilize the particular frame or word of code or to reject the same if errors were found therein. These devices would also enter the appropriate codes to the encoder 50. Thus, for instance, if a microprocessor or other like logic device was given a particular address it could load its address codes via the encoder 50 and only receive appropriate code frames or words which were directed to its particular address.

Figure 3B:
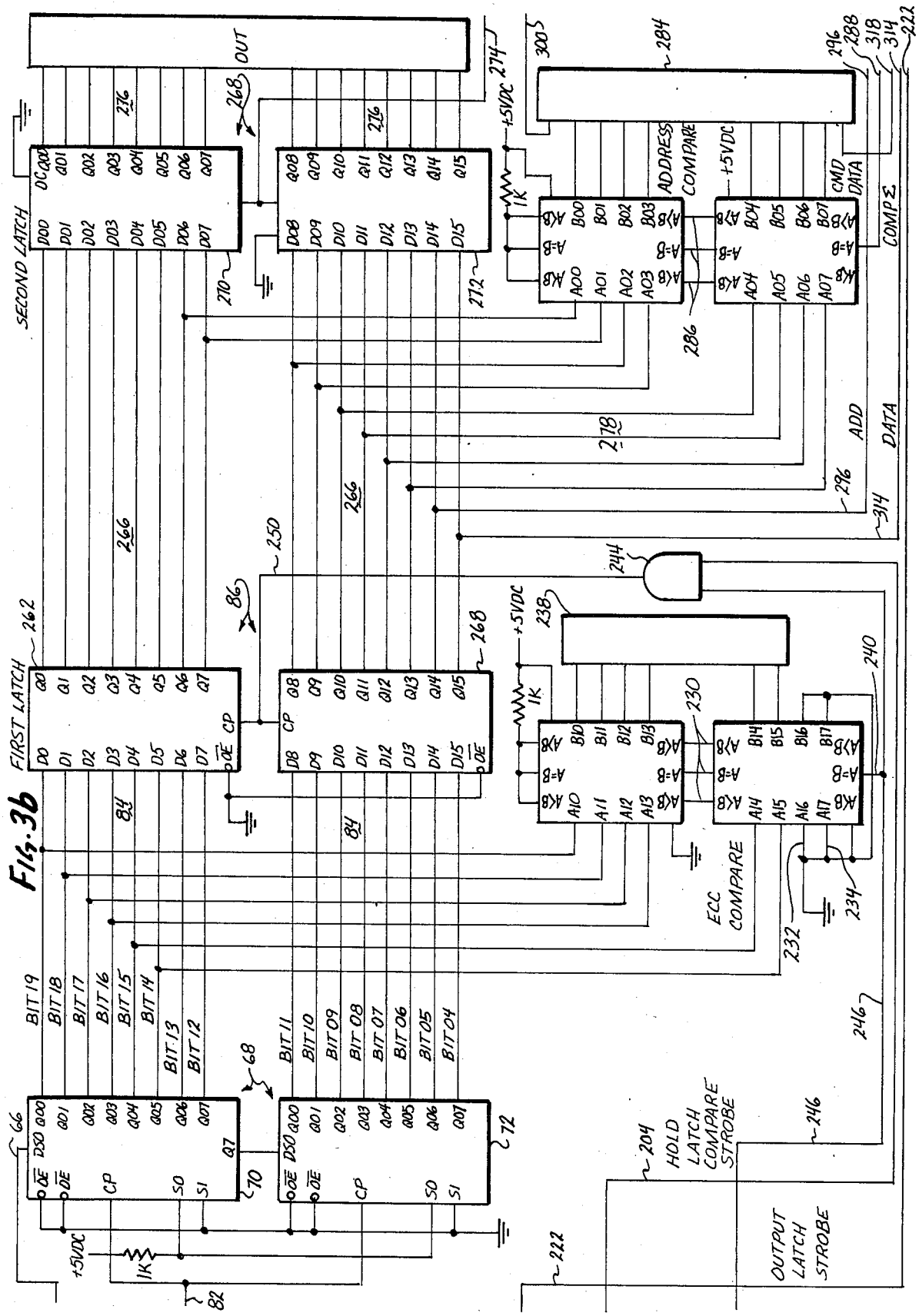
Figure 3C:
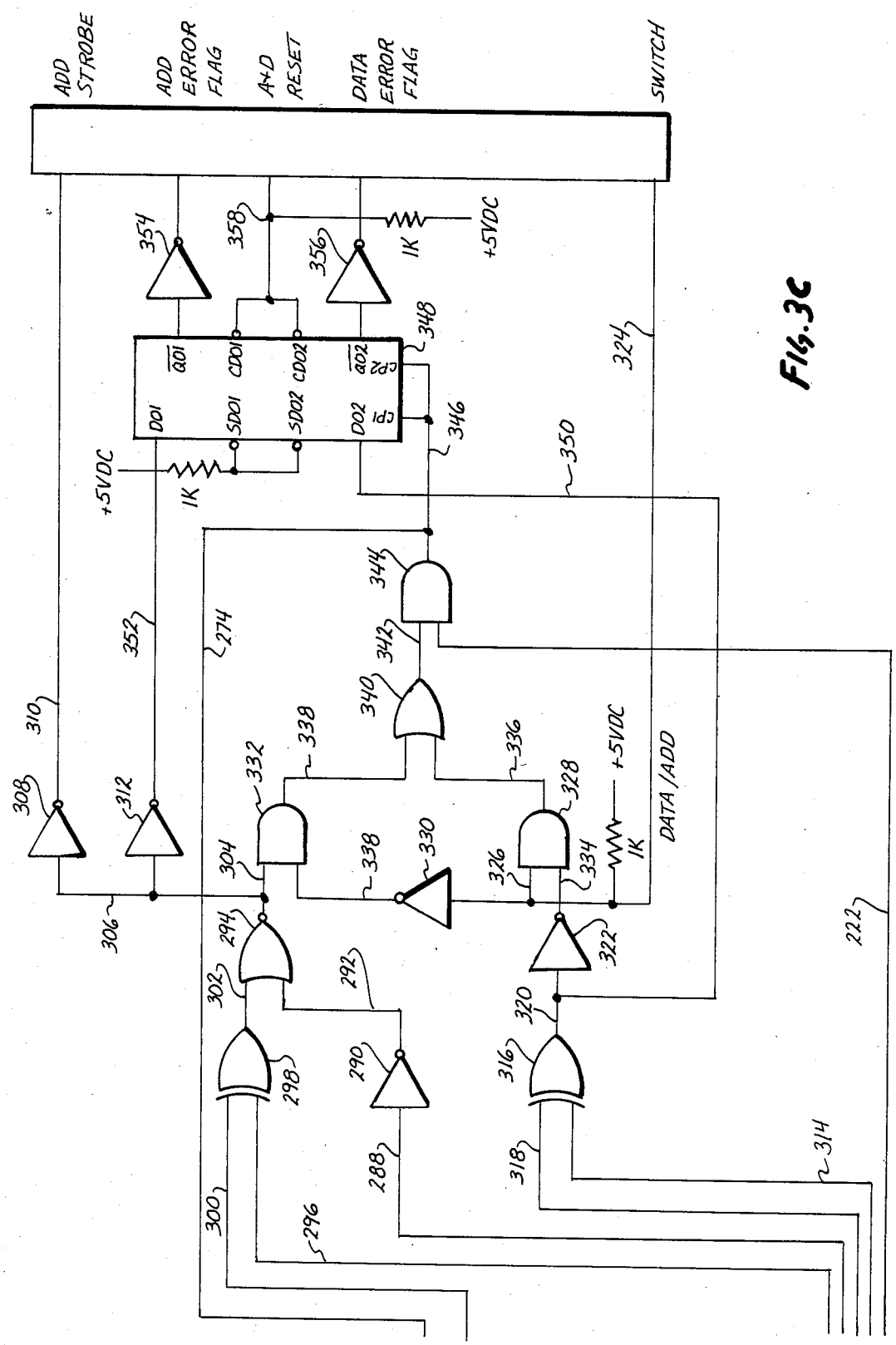

FIG. 3 shows a circuit for implementing the device 10 of FIG. 1. In FIG. 3 Manchester biphasic code at 10 MHz is input at line 62. Code input to line 62 in serial form is propagated via lines 64 and 66 to a code receiving element generally depicted by the numeral 68 which is made up of two shift registers 70 and 72. This code is also propagated via line 74 to a clock recovery logic generally depicted by the numeral 76. Clock pulses, as hereinafter described, are outputted the via clock recovery logic 76 on line 78 to a clock pulse conditioning logic generally depicted by the numeral 80. After the clock pulses are conditioned they are output via line 82 to the CP inputs of the shift registers 70 and 72.

The clock recovery logic 76 outputs a series of 10 MHz clock pulses recovered from the input 10 MHz code. The clock pulses output via the clock logic circuit changes from HIGH to LOW, stay LOW for 25 ns and then return HIGH for 75 ns. The clock conditioning logic 80 inverts these clock pulses such that the clock pulses go from LOW to HIGH, stay HIGH for 25 ns and then return to LOW for 75 ns. Additionally it slightly delays the clock pulses as will be explained in greater detail hereinafter. This clocks the shift registers 70 and 72 whereby the individual bits of a frame of Manchester data are stepwise entered and shifted through the progressive registers in the shift registers 70 and 72.

The shift registers 70 and 72 each are capable of holding 8 bits of data. As will be discussed when the clock recovery logic 76 is discussed in detail, a clock pulse is first output to the shift registers 70 and 72 in the mid bit transition of bit number 3 of the code frame. A further clock pulse is propagated to the shift registers 70 and 72 at each mid bit transition from bits 4 through 19 making a total of 17 clock pulses. As a frame of Manchester data is loaded into the shift register 70 it is stepwise pulsed through the shift register 70 and into the shift register 72. The leading bit, bit number 3, the start bit, is stepped off of the shift register 72 and is lost leaving bits 4 through 19 in the shift registers 70 and 72.

One additional clock pulse is propagated to the shift registers 70 and 72 when the transition occurs in the middle of bit 1 during the sync frame when the sync frame changes from HIGH to LOW. This clock pulse in not used. Just prior to propagation of this clock pulse to the shift registers 70 and 72 if, in fact, Manchester data has been received as is evidenced by the presence of the mid bit transition in the frame sync and certain error parameters are met in the data from bits 4 through 19 which are loaded into shift registers 70 and 72, the data in the shift registers 70 and 72 is propagated via bus 84 to a first holding latch generally depicted by the numeral 86.

As noted above clock pulses on the line 78 output by the clock recovery logic 76 are inverted within the clock pulse conditioning logic 80. This is done via inverter 88. Additionally, a variable delay 90 set to approximately 20 ns, delays propagation of the clock pulses to the shift registers 70 and 72. This also delays the clock pulse which is generated from the mid bit shift in the sync frame. This gives additional time for loading of the data bits from the shift registers 70 and 72 via the bus 84 to the first holding latch 86. As will be evident when certain of the timing diagrams of FIG. 2 are discussed, there is an inherent delay between bit 19 and the bit 1 mid bit transition. Together this delay plus the delay introduced by the variable delay 90 insures sufficient time for loading of the data bits from the shift registers 70 and 72 to the first holding latch 86 after the appropriate data bits from the frame of data are loaded in the shift registers 70 and 72.

The clock recovery logic 76 generates the clock pulses as follows. Line 74 is connected directly to one input of a XOR gate 92. The other input of XOR gate 92 is connected to line 74 via a 15 ns delay 94. Utilizing positive logic as will be utilized throughout the remainder of the discussion of individual gates in this specification, whenever inputs to the gate 92 are the same, a LOW or 0 signal is output. It is only upon a transition from a LOW signal to a HIGH signal or from a HIGH signal to a LOW signal coupled with a delay of this transition by the 15 ns delay 94 that the inputs are different to the XOR gate 92. Thus, only at signal transitions whether they be leading edge transitions, i.e. transitions from a LOW state to a HIGH state hereinafter referred to as "LE", or trailing edge transitions, i.e. transitions from a HIGH state to a LOW state hereinafter referred to as "TE", will the inputs to the gate 92 will be different.

Upon an LE or TE transition the gate 92 will output a HIGH or logical 1 signal. By utilizing the 15 ns delay 94 on one of the inputs of the XOR gate 92, the output of XOR gate 92 goes HIGH only at one of a leading or trailing edge transition and at all other times its outputs is LOW or a logical 0 signal.

The output of the XOR gate 92 is fed to one input of a NAND gate 96 via line 98. Two NAND gates 100 and 102 comprises an RS flip-flop. Output from the NAND gate 96 is input via line 104 to the NAND gate 100. Output from NAND gate 102 is input through a 25 ns delay 106 to line 108 to the other input of NAND gate 96.

Line 109 branches from line 104 and feeds invertor 110. Invertor 110 in turn feeds input line 112 of NAND gate 114 and input line 116 of NAND gate 118. The other input of NAND gate 114 is via line 120 which is the output line of gate 100 of the RS flip-flop made up of gates 100 and 102.

The output of NAND gate 114 is passed through a 75 ns delay 122 and input into gate 102 via line 124 as well as input into a NAND gate 126 via line 128. The NAND gate 126 is also part of an RS flip-flop in conjunction with a further gate, a NAND gate 130. The output of NAND gate 126 serves as the other input 132 of NAND gate 118 and the output of NAND gate 118 aside from feeding line 78, the output line of the clock recovery logic 76, also is fed via line 134 through a 25 ns delay 136 which in turn serves as an input via line 138 to NAND gate 130.

Referring briefly to FIG. 2, line 2C, during bit 0 and the first half of bit 1, for at least 150 ns if the previous bit 19 was a binary 1 or 200 ns if the previous bit 19 was a binary 0 (LOW), the signal to both of the inputs of XOR gate 92 will be the same, that is these inputs will be HIGH. This gate thus outputs a LOW signal. This is fed via line 98 to NAND gate 96. Irrespective of its other input NAND gate 96 always outputs a HIGH signal if one of its inputs is LOW. Therefore lines 104 and 109 are HIGH. Invertor 110 inverts this HIGH signal and imposes a LOW signal on lines 112 and 116 to NAND gates 114 and 118 respectively. This LOW signal irrespective of the other input of these two NAND gates causes these two NAND gates to output a HIGH signal. Thus a HIGH signal is outputted on the output line 78 of the clock recovery logic 96 as well as to the 75 ns delay 122.

At the TE edge transition in the middle of bit 1 as seen in FIG. 2C the signal goes from a logic 1 to a logic 0, that is it goes from HIGH to LOW. As will hereinafter be evident the RS flip-flop composed of gates 100 and 102 was set in a state by bit 19 such that the output of gate 100 was LOW and the output of gate 102 was HIGH. During the total time of the frame sync HIGH state, i.e. during bit 0 and the first half of bit 1, the input via line 108 to NAND gate 96 is HIGH. When line 98 also goes HIGH upon the mid bit transition of bit 1, i.e. the TE in the middle of bit 1, both of the in puts on NAND gate 96 are now HIGH and its outputs goes LOW.

The LOW output of gate 96 SETs the RS flip-flop composed of gates 100 and 102 such that the output of gate 100 is now HIGH. Concurrently the LOW output state of gate 96 is inverted at invertor 110 such that both of the inputs to gate 114 are HIGH and therefore gate 114 outputs LOW.

Further, as will be hereinafter evident from the discussion of the state of the gates in the clock recovery logic 76 at the end of a frame, i.e. after bit 19, the RS flip-flop comprising gates 126 and 130 was left in a state where the output of gate 126 was HIGH. When the input line 116 is also HIGH because of the transition in the middle of bit 1, both inputs to NAND gate 118 are HIGH and it thus outputs a LOW signal.

The LOW signal of gate 118 after being delayed 25 ns by the delay 136 is input to gate 130. This LOW signal RESETS gate 130 such that the output of gate 130 is HIGH and the output of gate 126 is LOW. Thus, 25 ns after the output of gate 118 went LOW, the RS flip-flop composed of gates 126 and 130 is RESET. When this happens irrespective of what is on line 116, line 132 goes LOW and the output of gate 118 therefore is HIGH. This serves to form a 25 ns wide clock pulse on the line 78 which is the output line of the clock recovery logic 76.

75 ns after the TE resulting from the mid bit transition of bit 1 has been output by the NAND gate 114, it has propagated through the delay 122 and onto line 124. This then switches the input to gate 102 to LOW which RESETs gate 102, i.e. RESET the RS flip-flop composed of gates 100 and 102. The output of gate 100 is now LOW and the output of gate 102 is now HIGH.

During the last half of the frame sync, i.e. the last half of bit 1 and during the total time of bit 2, the input to the XOR gate 92 are the same therefore its output is always LOW. The signal on line 108 at this time stays HIGH. Since the input on line 98 to NAND gate 96 is LOW, NAND gate 96 always outputs a HIGH signal which is inverted by invertor 110 propagating a LOW signal to NAND gates 114 and 118 maintaining their outputs HIGH.

Just prior to the mid bit transition in bit 3, i.e. the start bit, the input to gate 96 via line 108 is still HIGH, the input to gate 114 via line 120 is LOW and the input to gate 118 via line 132 is HIGH. At the LE mid bit transition in the middle of bit 3 the inputs to the XOR gate 92 are of different states therefore it outputs a HIGH signal. Since both of the inputs to NOR gate 96 are now HIGH it outputs a LOW signal. This SETs the RS flip-flop composed of gates 100 and 102 such that the output of gate 100 is HIGH and that of gate 102 is LOW. Concurrently, the signal on line 109 is inverted by invertor 110 such that now both the input signal on line 112 and input signal on line 120 to AND gate 114 are HIGH and AN gate 114 outputs a LOW signal to delay 122. Likewise the two inputs to gate 118 are now also HIGH and gate 118 outputs a LOW signal.

The LOW signal output by the gate 118 puts the signal LOW on the output line 78 of the clock recovery logic 76. This is ultimately is inverted by the invertor 88 in the clock pulse conditioning logic 80 to form the LE of a clock pulse which is output to the shift registers 70 and 72. 25 ns later the LOW state of gate 118 is passed through the delay 136 and onto the line 138 to RESET the RS flip-flop composed of gates 126 and 130 such that the output of gate 130 goes HIGH and the output of gate 126 on line 132 goes LOW. Thus 25 ns later irrespective of what the signal on line 116 is, since there is a LOW input signal on line 132 to NAND gate 118 its output goes HIGH. This HIGH signal is then inverted by the invertor 88 and the clock pulse on line 82 goes back to LOW.

Until the RS flip-flop composed of gates 100 and 102 is RESET the output of gate 102 is LOW and thus one of the inputs to gate 96 is always LOW and as such its output will always be HIGH. Thus, if there is a transition 50 ns after the mid bit transition of bit 1, as for example a phase transition between bits 3 and 4, it will be ignored because one of the inputs to NAND gate 96 will be LOW; however, 75 ns later the LOW signal output by the gate 114, because of the mid bit transition in bit 3, has now been propagated through the delay 122 and onto line 124. This puts line 124 LOW, i.e. sets one of the inputs to gate 106 LOW such that it is RESET. The output of gate 102 is now HIGH. 25 ns later this input is propagated to line 108 and sets one of the inputs to NAND gate 96 HIGH.

If the code is not in the frame sync but it is in the data, address or error code portions of the code frame, either a leading or a tailing edge comprising a mid bit transition is now input to the XOR gate 92. Because at such a transition the inputs to XOR gate 92 will be different, its output will be HIGH. Now both of the inputs to the NAND gate 96 are HIGH and as such its output is LOW. This again RESETs the flip-flop composed of gates 100 and 102 resulting in the output of gate 100 going HIGH. Further, the signal to the invertor 110 is LOW on line 109 and thus lines 112, and 116 go HIGH. At this point in time both inputs to gate 114 are HIGH thus it outputs a LOW signal. Also, both inputs to gate 118 are HIGH so it outputs a LOW signal. Thus, line 78 once again goes LOW and after this is inverted via the invertor 88 a HIGH clock pulse is output onto line 82. As before, after 25 ns the RS flip-flop composed of gates 126 and 130 is RESET and the signal on line 78 goes HIGH and therefore the signal output on line 82 goes LOW.

A chain of clock pulses is therefore generated on line 82 with the LE going HIGH corresponding to the mid bit transition starting at bit 3 to bit 19 inclusively. This clock signal stays HIGH for 25 ns governed by the delay 136 which RESETs the RS flip-flop composed of gate 126 and 130 after this 25 ns delay.

Phase transitions for adjacent 1's or 0's are masked out by the 75 ns delay of delay 122 which delays setting the RS flipflop composed of gates 100 and 102 for this 75 ns delay. When this flip-flop is RESET such that the NAND gate 102 outputs a HIGH signal, this HIGH signal is delayed for 25 ns by the delay 106 before being imposed on one of the inputs of NAND gate 96. This 25 ns delay filters out any "slivers or race conditions" which might be in the code being received by the device by delaying the imposition of the needed HIGH signal on line 108 until a further potential transition is due to be detected via the delay 94 and the XOR gate 92.

As each mid bit transition is detected it causes the LE of clock pulse to occur on line 82. Near the end of a particular frame or word the mid bit transition of bit 18 SETs the RS flip-flop composed of gates 100 and 102, it is RESET 75 ns later and once again SET by the mid bit transition in bit 19. If bit 19 is a logic 0, at the beginning of bit 0, i.e. the beginning of the sync frame, the next transition from LOW to HIGH occurs within a 50 ns window. As such it is not picked up and the RS flip-flop composed of gates 100 and 102 stays in the state wherein it has been SET by the mid bit transition in bit 19, that is the output of gate 100 is left in a HIGH state. If bit 19 was a logical 1, its mid bit transition would therefore go from LOW to HIGH and again the state of the RS flip-flop comprising gates 100 and 102 would be such that the output of gate 100 would be HIGH.

The initial delay 94, the XOR gate 92, the NAND gate 96 and the delay 106 comprise a transition detect means. The gates 100, 102, 114, the invertor 110 and the delay 122 comprise a clock delay reset means. The gates 126, 130, 118 and the delay 136 comprise a clock pulse width means. And as noticed previously, the invertor 88 and the delay 90 comprise the clock pulse conditioning logic 80.

A clock is thus recovered from the incoming Manchester data starting at bit 3 and is maintained through bit 19. This allows for clocking of this data through the shift registers 70 and 72. One further pulse occurs at the mid bit transition in the sync frame at the center of bit 1, however this pulse is blanked out by the delay 90. The delay 90 is typically set at about 20 ns. Disregarding for a moment the slope of the signal transition, since the state of the signal of any of the data bits is constant for essentially 50 ns from the mid bit transition to a phase transition, if there is a phase transition, or for essentially 100 ns if there is not a phase transition, the imposition of the signal delay by the delay 90 does not interfere with loading of the individual bits into the shift registers 70 and 72.

As with any device, normally there is not an instantaneous shift between the HIGH and LOW signal states but a sloping transition. Thus, instead of a sharp square wave there will be a transition slope at each signal transition. Because of this, normally the leading and trailing edges corresponding to either mid bit or phase bit transitions will be shifted about 10 ns from the actual transitions of the code signal. Because of this in line 2D of FIG. 2, wherein the leading and trailing edge transitions are shown and in line 2E wherein the recovered clock pulses output to the shift registers 70 and 72 are shown, the square wave transition are shown with a 10 ns delayed shift.

Manchester data input to line 62 is also fed to a frame sync recover logic generally depicted by the numeral 140 in FIG. 3. Signal is fed directly via line 142 to side 1 a dual D-type flip-flop 148. Signal is also fed to a line 144 which branches into line 146 and a further line hereinafter identified. Line 146 connects to an invertor 150. A line 152 from invertor 150 feeds inverted signal to side 2 of this D-type flip-flop 148. Both of the data pins D1 and D2 to the two sides of flip-flop 148 are tied to ground via lines collectively identified by the numeral 154. Thus a LOW signal is input to both of the D1 and D2 terminals of the D-type flip-flop 148. A HIGH signal is input via line 156 to the clear pins CD1 and CD2 on both sides of this flip-flop. Line 142 attaches to the clock CP1 terminal of side one of the flip-flop 148 and line 152 is tied to the clock CP2 terminal of side two of the flip-flop 148. Line 158 leads from the Q1 terminal of the flip-flop 148 and line 160 leads from $\overline{Q1}$ of the flip-flop 148. Line 162 leads from Q2 of the flip-flop 148.

Signal from line 158, i.e. Q1, is used as delayed feedback via invertors 164 and 166 to line 168 which connects to the SET terminal SD1 of the first side of the flip-flop 148. In a like manner signal from line 162 is used as delayed feedback via invertors 170 and 172 to the second side SET terminal SD2 of the flip-flop 148 through line 174.

Flip-flop 148 is selected as a positive edge clocked D-type flip-flop. When Manchester code on line 142 goes through a LE transition, that is from a LOW state to a HIGH state, i.e. logic 0 to logic 1, this enables the clock, i.e. CP1, of the first side of flip-flip 148, that is we have a positive going pulse input to CP1 of the first side of flip-flop 148. When clocked, whatever is imposed on the D1 terminal of the first side of flip-flop 148 is output on Q1. Thus, in response to a LE transition, i.e. from a logic 0 to a logic 1, the output of Q1 goes LOW. Conversely, the output of $\overline{Q1}$ goes HIGH. The LOW signal imposed on line 158 by Q1 of flip-flop 148 is propagated through the invertors 164 and 166. They first invert the signal to a HIGH state via invertor 164 and then reinvert it to a LOW signal via invertor 166. The devices utilizes for the invertors 164 and 166 are chosen such that they have about a 10 ns delay each. Thus, the signal propagated through the invertors 164 and 166 is delayed 20 ns with respect to the signal imposed on line 158.

This delayed LOW signal is imposed onto the set pin SD1 of the first side of the flip-flop 148. When a LOW signal is imposed on a set pin of a D-type flip-flop such as used for the flip-flop 148, it immediately outputs a HIGH state on Q1 and a LOW state on $\overline{Q1}$. This returns the output on line 158 to HIGH and the output on line 160 to LOW. Thus, line 158 in response to each positive going transition in the code imposed on line 62 will go from HIGH to LOW, stay LOW for 20 ns and then return to a HIGH state and the output on $\overline{Q1}$, line 160, will go from LOW to HIGH, stay HIGH for 20 ns and then go back LOW.

The output to the second side of the flip-flop 148 is responsive to TE transitions, that is transitions from a HIGH state to a LOW state. Because of the invertor 150 when transitions from a HIGH state to a LOW state incur in the code on line 62 these are inverted and are output on line 152 as transitions from a LOW state to a HIGH state. This then clocks the second side of the flip-flop 148. As per the above first side, when this clock pulse is imposed on the CP2 clock pin of the second side of flip-flop 148, Q2 goes LOW. Because of the invertors 170 and 172 the output on line 162 will remain LOW for 20 ns at which time a set pulse is fed back to the second side of the flip-flop 148 and line 162, i.e. Q2 returns to HIGH.

NAND gates 176 and 178 form a RS flip-flop. Additionally NAND gates 180 and 182 form a further RS flip-flop. One of the inputs of both NAND gates 178 and 182 are tied to line 162 which is responsive to the TE pulses in the Manchester code input to line 62. In response to each TE pulse, line 162 goes LOW and consequently RESETs gates 178 and 182. When this happens the output of gates 178 and 182 both go HIGH.

At each LE in the Manchester code on line 62, line 158 goes LOW. This SETS NAND gate 176. Thus the RS flip-flop composed of gates 176 and 178 is SET upon a LE in the code and RESET on a TE in the code.

A LE on line 158 sets NAND gate 176 such that its output is HIGH. If we are in the data portion of the code, i.e. bits 3 through 19, at either 50 ns or 100 ns a TE will occur. $\overline{Q1}$ via line 160 feeds a delay 184. This is chosen as a 60 ns delay. Line 186 from delay 184 serves as one input to an AND gate 188. Line 190 from NAND gate 176 serves as the other. If a LE sets NAND gate 176 such that its output is HIGH and if a TE does not occur within 60 ns, a HIGH signal is propagated from line 160 through delay 184 to line 186. At this time if both inputs on line 186 and line 190 to AND gate 188 are HIGH, AND gate 188 outputs a HIGH signal onto its output line 192. If a TE had occurred within this 60 ns and gate 178 was RESET the output from gate 176 on line 190 would be LOW and when the 60 ns delay through delay 184 was fed as a HIGH signal on line 186 to gate 188 the other input on line 190 would be LOW and AND gate 188 would output a LOW signal onto line 192. Thus, the delay 184 serves as a low bandpass filter to filter out any 50 ns transition in the code input on line 62.

If there was no transition within 50 ns and the output of AND gate 188 onto line 192 is HIGH this signal is delayed further by another 60 ns delay, delay 194. Delay 194 outputs onto line 196 which serves as one input to a NAND gate 198. The other input to NAND gate 198 is line 200 which branches from line 142 which in turn is tied to the input line 62.

If a 50 ns transition occurred in the code on line 62 it would have been filtered out by delay 184. If a 100 ns transition occurred, by the time signal is propagated through the delay 194 and onto line 196 there would be a 120 ns time difference. Assuming a 100 ns transition occured, line 200 will change states at the 100 ns transition. Because of the 100 ns transition, when the 120 ns delayed signal arrives at NAND gate 198 on line 196 the input to NAND gate 198 on line 200 would be of the opposite state and as such the output of NAND gate 198 on line 202 would be HIGH.

If, however, the initial LE which caused line 160 to go HIGH was LE transition between bit 19 and bit 0 at the start of the sync frame, line 200 would remain HIGH because it would still be within bit 0 or the first half of bit 1 within the sync frame. At this time if propagation through the two delays 184 and 194 impose a HIGH signal on line 196, both line 196 and line 200 are HIGH and therefore NAND gate 198 outputs a LOW signal on line 202. This LOW signal would therefore represent a delayed LE and would SET gate 180 such that its output is HIGH.

Referring now to FIG. 2, line 2F represents a 60 ns delayed LE, hereinafter referred to as a "DLE", when bit 19 was a logic 1 such that there was a leading edge transition (a LE) from LOW to HIGH in mid bit 19 as is seen on line 2D. Line 2G represents a 120 ns DLE for this same condition.

If bit 19 was LOW such that there was a LE phase transition in between bits 19 and bit 0 as is shown on line 2H, then the 60 ns DLE is as is seen on line 2I. Further, the 120 ns DLE is as seen on line 2J. Whether or not bit 19 was a logical 1 or was a logical 0 the 120 ns DLE, lines 2G and 2J both occur prior to the mid bit transition of bit 1 in the center of the frame sync.

When line 202 is LOW corresponding to the presence of a 120 ns DLE, the output of gate 180 on line 204 goes HIGH. Line 204 serves as a hold latch strobe as will be discussed below. Line 204 goes HIGH either as shown for line 2K in FIG. 2 or 2L of FIG. 2 depending upon the state of bit 19 after its mid bit transition.

When a TE, i.e. the mid bit transition at bit 1 within the sync frame, is imposed onto line 62 this is propagated through flip-flop 148 onto line 162 and RESETS gate 182 as described above. When gate 182 RESETS, line 206 goes HIGH and line 204 LOW. At this point, as is seen in FIG. 2, the hold latch strobe either lines 2K or 2L now returns to a LOW state. Depending upon the state of bit 19 the hold latch strobe was HIGH for at least 25 ns as is seen on line 2L or up to 75 ns as is seen on line 2K. It was driven HIGH by the 120 ns DLE and returned LOW by the TE.

There is a further RS flip-flop within the frame sync recovery logic 140. It is composed of a NAND gate 208 and a NAND gate 210. NAND gate 208 has as one of its inputs line 212 which is connected to line 158. Thus, when line 158 goes LOW in response to a LE this SETS NAND gate 208 such that its output, line 214, goes HIGH.

Line 206, previously described, branches into line 216 which serves as an input to gate 210 and line 218 which serves as an input to an AND gate 220. A further line 224, the output line from NAND gate 210 serves as the second input to AND gate 220.

Upon a LE, NAND gate 208 is SET as previously described. This sets line 214 HIGH and line 224 LOW. When a DLE is propagated through to gate 180 it SETS gate 180 and line 204 goes HIGH and line 206 goes LOW. The LOW signal on line 206 is propagated through line 216 to NAND gate 210 and RESETS gate 210 such that line 224 goes HIGH. At this time, since line 206 is LOW, line 218 is also LOW and thus one of the inputs to AND gate 220 is HIGH and the other is LOW. Therefore the output from AND gate 220 on output latch strobe line 222 is LOW. However, if gate 210 was RESET by a DLE, that is the output of gate 180 went HIGH and the output of gate 182 and thus line 216 went LOW which RESETs the gate 210 and sets the line 224 HIGH, followed by gate 182 being RESET by a TE wherein line 206 and thus line 218 goes HIGH, both of the inputs to AND gate 220 are now HIGH and it outputs a HIGH signal as an output latch strobe on line 222. This is shown at lines 2M and 2N of FIG. 2. Line 222 stays HIGH until the next LE on line 212 SETS gate 208 such that line 214 goes HIGH and line 224 goes LOW and consequently the output of AND gate 220 on the output latch strobe line 222 goes LOW.

The RS flip-flop consisting of gates 208 and 210 is therefore SET by a LE and RESET by a DLE. The RS flip-flop consisting of gates 180 and 182 is SET by a DLE and RESET by a TE. The input signal to AND gate 220 is therefore only HIGH on both of its inputs in between a DLE and a TE. This only occurs in the sync frame in bits 0 and the first half of bit 1. In the data bits, bits 3 through 19, either the flip-flops 176 and 178 are continually SET and RESET by LE and TE edges which are separated by 50 ns or they are SET and RESET by LE and TE edges which are separated by 100 ns. The combination 120 ns delay achieved via delay 184 plus delay 194 filters out these 50 and 100 ns signal transitions to prevent the output of gate 180 going HIGH, that is being SET except in response to a DLE.

It is evident that the hold latch strobe on line 204 only goes HIGH in between a 120 ns or greater DLE and a TE in the code, that is within bits 0 and 1 in the frame sync in the Manchester code and the output latch strobe on line 222 only goes HIGH after a 120 ns delay, that is a delay that can only be present in the frame bits 0 and 1 followed by a delay LE at the mid bit transition of bit 1 in the frame sync. This serves to recognize the Manchester code by virtue of its frame sync and to first set the hold latch strobe HIGH from the DLE to the center of the frame sync bit, i.e. the mid bit TE transition in bit 1, and secondly to set the output latch strobe HIGH starting at this center of the frame sync to the next LE at the mid bit transition of bit 3.

The D-type flip-flop 148 and the inverting gates 164, 166, 170 and 172 serve as a code sync pulse generating means. The delays 184 and 198, the NAND gates 176, 178, 198 and the AND gate 188 serve as a sync pulse delay means. The NAND gates 180 and 182 serve as a sync center detect means. The NAND gates 208 and 210 and the AND gate 220 serve as a sync strobe means.

Two comparators 226 and 228 serve as a first error comparator. In one Manchester protocol utilized; 6 bits are reserved for error codes. These 6 bits are fed to the comparators 226 and 228. The comparators 228 and 226 are tied together via lines collectively identified by the numeral 230 to function as a 8 bit comparator, only 6 bits of which are utilized for the circuit of FIG. 3. The other two pins of the comparator 228 are tied to ground via a lines 232 and 234 and are not used. However, they could be utilized if, in fact, in a different code protocol a different number of error codes were utlized. The comparators 226 and 228 are tied to bits 14 through 19 by a bus 236 which connects to bus 84.

An encoder 238 is utilized to input a set of parameters against which the comparators 226 and 228 will test the output lines for bits 14 through 19 of the shift registers 70 and 72. A line 240 is connected to the A=B pin of the comparator 228.

Line 240 is branched. One of its branches 242 serves as an input to an AND gate 244. The other of its branches 246 serves as an input to the D pin of a further D-type flip-flop 248. The other of the inputs of the AND gate 244 is tied to the hold latch compare strobe line 204. Thus, when both lines 242 and 204 go HIGH, an output line 250 of the AND gate 244 will go HIGH.

Prior to discussing the consequences of the output of AND gate 244, a branch 252 of line 204 is tied to the clock CK pin of the flip-flop 248. The set pin SD1 of flip-flop 248 is tied HIGH and its clear pin CD is tied via a line 254 to a switch and set HIGH.

A line 256 tied to $\overline{Q}$ of flip-flop 248 goes through inverter 258 and to an output line 260. Line 260 serves as a error flag to indicate when there is a lack of correspondence between a set of parameters input on the encoder 238 and those found on the 6 highest bits, i.e. bits 14 through 19 of the frame or word residing in the shift register 70. When there is a lack of correlation, line 240 is LOW since A does not equal B and consequently line 246 is also LOW. When the hold latch compare strobe line 204 goes HIGH at the beginning of the next proper Manchester word or frame this clocks the flip-flop 248 since the line 252 to the clock pin of flip-flop 248 is tied to line 204. In response to a clock pulse a LOW signal on line 246 is propagated internally in the flip-flop 248 from the D pin of the flip-flop 248 to pin $\overline{Q}$ and is inverted via an inverter 258 and propagated out on a line 260 as a HIGH error flag. This is then RESET by closing the switch tied to line 254 grounding line 254 and bringing the clear pin of flip-flop 248 to ground which serves to RESET $\overline{Q}$ to a HIGH state.

It is, of course, evident that line 260 could feed a further appropriate logic device and line 254 could be the output of such further logic device. These would serve as I/0 lines between such a further logic device.

When a frame or word of the Manchester code is loaded in the shift registers 70 and 72 by bit wise shifting this frame through the registers, the next adjacent frame or word starts with its frame sync. If this frame sync is proper, that is if there is a DLE followed by a TE the hold latch compare strobe on line 204 goes HIGH. If concurrently the comparators 226 and 228 also output an A=B signal, i.e. a HIGH state on line 242 indicating the codes on bits 14 through 19 are proper and compare to the parameter inputted via encoder 238, line 242 goes HIGH. Thus, the output on line 250 from AND gate 244 goes HIGH.

The output line 250 of AND gate 244 is tied to the clock pin CP of two identical latches 262 and 264. The latches 262 and 264 serve as the previously identified first holding latch 86.

Latches 262 and 264 are chosen such that when there is a LOW to HIGH transition on their clock pins CP, i.e. a LOW to HIGH transition on line 250, they load what is on their input bus, i.e. bus 84 connecting them to the shift registers 70 and 72. Thus, data from shift registers 70 and 72 is loaded into the first holding latch 86 when both the error codes on bits 14 through 19 match the parameters encoded via the encoder 238 to the comparators 226 and 228 and also proper Manchester code is indicated by the hold latch compare strobe line 204 going HIGH. If one or the other of these criteria is not met the frame or word in the shift registers 70 and 72 is not loaded into the first latch 86 and when the next frame or word is propagated to the shift registers 70 and 72 on line 66 this error containing word is written over and is lost, that is a new word loads over and erases the old error containing word.

Because of the presence of the delay 90 on the clock line 82 the TE clock pulse characterized by the mid bit transition of bit 1 in the middle of the frame sync is delayed from clocking the shift registers 70 and 72 by the time set in the delay 90. This then extends the time period when the hold latch strobe line 204 goes HIGH and a new word is loaded on the shift registers 70 and 72. This insures that an old correct word in the shift registers 70 and 72 is loaded into the first holding latch 86 prior to clocking of a new word into the shift registers 70 and 72. As per line 2L of FIG. 2, at the minimum the hold latch strobe would clock HIGH about 25 ns before the delayed edge indicative of the mid bit transition in bit 1 within the frame sync occurs, however, by incorporating the variable delay 90 in the line 82 an additional time period as, for instance, 20 ns can be introduced into the clock pulse feed to the shift registers 70 and 72.

The AND gate 244 serves as an enabling means for enabling the first hold latch 86. It is enabled concurrently by both the presence of the hold latch strobe and the proper error code on bits 14 through 19. It is, of course, evident that one or the other of these could be used as a single enabling means by tying it to both of the inputs of AND gate 244 to enable the first holding latch 86 however it is preferred to utilize both the hold latch strobe and the proper error code in combination to insure that both the Manchester code is present and that a proper error code protocol is also met.

The latches 262 and 264 are selected such that when the clock pulse on line 250 goes from LOW to HIGH, data on their input pins is latched onto their output terminals. Thus, at the presence of a LOW to HIGH signal on line 250, data from bus 84 is transferred to a bus 266.

Bus 266 serves as input to a further set of output latches, a second holding latch generally depicted by the numeral 268. Second holding latch 268 includes identical latches 270 and 272. These latches are chosen such that when their latch enable, i.e. their ENBC pins, tied to a line 274 goes HIGH they become transparent to data and propagate what is on bus 266 to an output bus 276. The state of line 274 however, is controlled by the output latch strobe on line 222 in conjunction with a further error comparator.

Comparators 280 and 282 as well as some individual gates hereinafter described comprise a further error comparator means. The comparators 280 and 282 are connected to bits 6 through 13 via a bus 278 which connects to the bus 266.

An appropriate encoder 284 is utilized to input a second set of parameters to the comparators 280 and 282 as well as the additional hereinafter to be identified gates noted above. These parameters are utilized to compare the data bit, bit 4, and the address bits, bits 5 through 13 to preset parameters. The output of the comparators 280 and 282 and the additional gates to be hereinafter described, allows for shifting between a comparison of the data bit or a comparison of the address bits.

As with the prior comparators, comparators 280 and 282 are each 4 bit comparators and together they are capable of handling 8 bits. Since in the Manchester code illustrated there are 9 address bits, the first address bit, bit number 5 is individually compared to a preset parameter and then summed with the output of the comparators 280 and 282. The comparators 280 and 282 are cascaded together via lines collectively identified by the numeral 286.

The A=B output pin of the cascaded comparators 280 and 282 is fed via a line 288 through an invertor 290 and from there via a line 292 to a NOR gate 294. The first address bit, bit 5 on bus 266, is tied via a line 296 to one side of an XOR gate 298. The other side of the XOR gate 298 is tied via a line 300 to the encoder 284. Output for XOR gate 298 is fed via a line 302 to the NOR gate 294.

If the address on bit 5 matches that encoded onto line 300, XOR gate 298 outputs a 0. If the remainder of the addresses on bits 6 through 12 match that encoded via the encoder 284, line 288 goes HIGH and after being inverted by invertor 290 a LOW signal is output on line 292 to NOR gate 294. If both of the inputs to NOR gate 294, that is lines 292 and 302 are LOW indicating that the address bits compare to the address encoded via the encoder 284, the NOR gate 294 outputs a logic 1 or HIGH signal onto a line 304. This signal can be independently utilized via a line 306 and an invertor 308 as an address compare strobe on a line 310. Alternately, as hereinafter discussed, this signal on line 306 can be inverted via an invertor 312 and utilized to SET an appropriate error flag as hereinafter described.

In a like manner, signal on data bit 4 on bus 266 is fed via a line 314 to a XOR gate 316. A line 318 serves as the other input for XOR gate 316 and connects to the encoder 284. If the data on lines 314 and 318 match, the XOR gate 316 outputs a LOW signal onto a line 320. This is inverted via an invertor 322.

A switch line 324 is tied to an appropriate switch not separately described or shown and is tied HIGH. It serves directly as an input via line 326 to an AND gate 328 for data and through an invertor 330 to an AND gate 332 for address. If the switch is open, lines 324 is HIGH and input to data AND gate 328 on line 326 is HIGH. If simultaneously the output from invertor 322 onto a line 334 is HIGH, AND gate 328 outputs a HIGH input on a line 336. Thus, if it was selected to look at the data bit of the code, line 324 would be open and line 326 would go HIGH so that the "data" signal imposed on line 334 to the AND gate 328 would be propagated to line 336.

If it was desirous to look at the address bits, data line 324 would be grounded and therefore be LOW. This signal would be inverted via invertor 330 and a HIGH signal would be inputted via a line 338 to the address AND gate 332. If simultaneously line 304 was HIGH indicating proper correspondence of the address bits with the encoded address parameters, AND gate 332 would output a HIGH signal on output line 338.

Lines 336 and 338 serve as input lines to an OR gate 340. Depending upon whether the data or the address bits are selected, if the selected bit of the data or the address is correct, one or the other of the lines 336 or 338 would go HIGH and as such the OR gate 340 would propagate this HIGH signal to its output line 342.

The output line 342 serves as an input line for an AND gate 344. The other input line of AND gate 340 is the output latch strobe lines 222. If a signal indicative of either one of the data or the address being correct is imposed on line 342 and if the output latch strobe line 222 goes HIGH then this enables AND gate 344 and it outputs a HIGH signal on its output line 274 which as explained above serves as an enable line for the second output latch 268. Thus, for data to be propagated from the first output latch 86 through the second output latch 268 and onto the output bus 276, both one or the other of a proper data bit or proper address bits and the presence of Manchester code as is indicative of the output latch strobe line 222 going HIGH must be present. If either of these is not present then the AND gate 344 will not be enabled and data will not be transferred from bus 266 through the second output latch 268 to the output bus 276. The AND gate 344 thus serves as a second enabling means.

As with the first enabling means, one or the other of the input lines 222 or 342 could be tied to both inputs of the AND gate 344 allowing it to respond to only one or the other of either proper Manchester code or proper address or data parameter correspondence. However, it is preferred to utilize both of these as strobes such that the frame or word of code which has been propagated to the first latch 86 can be checked both as to one or the other of its data or its address and also to the proper appearance of Manchester code on the input lines 62.

A further output line 346 branches from the AND gate 344 and serves as an input line to the clock terminals CP1 and CP2 of a dual D-type flip-flop 348. Data correspondence is input to the D input of one side of this flip-flop via a line 350 connecting to pin D02 and address correspondence is input to the other D input via a line 352 connecting to pin D01. $\overline{Q1}$ via an invertor 354 serves as an address error flag and $\overline{Q2}$ via an invertor 356 serves as a data error flag for a data/address error output means which includes the flip-flop 348 and the appropriate invertors connected thereto. A RESET line 358 tied to the clear terminals CD01 and CD02 of the flip-flop 348 allows RESETing the data and address error flags.

The comparators 280 and 282 as well as the gates 294, 298 and the invertor 290 serve as an address error compare means whereas the gate 316 and the invertor 322 serve as a data error compare means. The gates 328, 332 and 340 serve as a data address error indicator means.

For use in the decoder comparator of the invention typically F series TTL devices will be utilized. These devices are very fast compared to other known devices and are capable of operating at a 10 MHz signal rate for 20 mb Manchester biphase code.

The following F series TTL or equivalent high speed devices capable of performing at the speeds and frequencies indicated are used in the decoder comparators of the invention:

| | |
|---|---|
| Gates 92, 298 and 316 | 54F286 XOR gates |
| Gates 96, 100, 102, 114, 126, 130, 118, 176, 178, 198, 180, 182, 208, 210 | 54F00 Quad NAND gates |
| Gates 188, 220, 244, 328, 332, 344 | 54LS08 Quad AND gates |

-continued

| | |
|---|---|
| Gate 294 | 54LS28 NOR gate |
| Gate 340 | 54LS332 OR gate |
| All of the various invertors | 54F04 Quad Invertors |
| Variable delay 90 | TTLDM-40MT |
| Delay 94 | TTLDL-16MT |
| Delays 106 and 136 | MTTLD-25MT delays |
| Delay 122 | MTTLD-75MT delays |
| Delays 184 and 194 | MTTLD-60MT delays |
| Flip-flop 148, 248 and 348 | 54LS74 D-type Flip-flop |
| Shift Registers 70 and 72 | 54F299 Shift Registers |
| Comparators 226, 228, 280 and 282 | SN54S85 Comparators |
| Latches 262 and 264 | 74F534 Latches |
| Latches 270 and 272 | 54LS3703 Latches |

I claim:

1. A decoder and comparator for a biphase code comprising
   code storage means for receiving a stream of said code and temporarily storing a frame of said code,
   clock recovery means for receiving a stream of said code and recovering clock pulses from said code, said clock recovery means outputting a train of clock pulses to said code storage means for loading said frame of said code into said storage means, and
   code frame recovery means for receiving a stream of said code and for recognizing a frame indicator in said code including
   sync pulse generating means for generating signals in response to code input,
   sync pulse delay means for delaying at least one of said generated signals,
   sync center detect means for detecting a center signal transition in a frame sync indicator, and
   sync strobe means for generating a strobe signal in response to at least the detection of said center signal transition in a frame sync indicator and for outputting at least one strobe signal to said code storage means for outputting a stored frame of code from said code storage means in response to recognition of said frame indicator.

2. The decoder and comparator of claim 1 wherein:
   said storage means includes at least a first latch means for temporarily holding a frame of code in said code storage means, said first latch means operatively associated with said code frame recovery means so as to be enabled at least in part by said code frame recovery means strobe signal.

3. The decoder and comparator of claim 2 further including:
   first error compare means for comparing at least a portion of a frame of said code which is temporarily being stored in said code storage means with a first set of parameters for compliance of said portion of said frame of code with said first set of parameters and for outputting a signal in response to compliance with said parameters.

4. The decoder and comparator of claim 3 further including:
   first enable means for controlling said first latch means;
   said first enable means receiving an input signal from at least said first error compare means so as to control said first latch means in response to at least said input signal from said first error compare means.

5. The decoder and comparator of claim 2 further including:

first enable means for controlling said first latch means;

said first enable means receiving an input strobe signal from at least said code frame recovery means so as to control said first latch means in response to at least said strobe signals from said code frame recovery means.

6. The decoder and comparator of claim 3 further including:

first enable means for controlling said first latch means, said first enable means operatively connected between said first latch means and both of said code frame recovery means and said first error compare means for receiving strobe signals from said code frame recovery means and for receiving output signals from said first error compare means to control said first latch means in response to said received code frame recovery strobe signals and said first error compare output signals.

7. The decoder and comparator of claim 6 wherein:

said first enable means enables said first latch means in response to simultaneously receipt of a strobe signal from said code frame recovery means and an output signal from said first error compare means.

8. The decoder and comparator of claim 1 wherein:

said code frame recovery means comprises a frame sync logic recovery means for recovering a particular frame sync sequence in a frame of said code and outputting at least one control strobe in response to recognition of said frame sync sequence in said frame of said code.

9. The decoder and comparator of claim 3 including:

first error indicator means for outputting an indication of compliance of said portion of said code with said first set of parameters.

10. The decoder and comparator of claim 1 wherein:

said clock recovery means includes a transition detection means for detecting transitions in said code between low and high signals;

said clock recovery means further includes clock delay reset means for resetting said clock recovery means in response to a delay of a signal propagation; and said clock recovery means further includes clock pulse width setting means for setting the width of clock pulses outputted in said train of clock pulses.

11. A device for recovering a frame sync indicator from a code data stream which comprises:

a sync pulse generating means for generating signals in response to code input;

a sync pulse delay means for delaying at least one of said generated signals;

a sync center detect means for detecting a center signal transition in a frame sync indicator; and a sync strobe means for generating a strobe signal in response to at least the detection of said center signal transition in a frame sync indicator.

12. A decoder and comparator for a biphasic code containing a frame sync comprising code receiving means for receiving a stream of said code and temporarily storing a frame of said code, clock recovery means for receiving a stream of said code and recovering clock pulse from said code, said clock recovery means outputting a train of clock pulses to said code receiving means for loading said frame of said code in said code receiving means, code frame sync recovery means for receiving a stream of said code and for recognizing the code frame sync, said code frame sync recovery means outputting at least one strobe signal, a first latch means for temporarily holding a frame of code, said first latch means operatively associated with said code frame sync recovery means so as to be enabled at least in part by said code frame sync recovery means strobe signal whereby a frame of code stored in said code receiving means is propagated to said first latch means, and a second latch means for receiving a frame of code from said first latch means and outputting said frame of code on an output bus, said second latch means operatively associated with said code frame sync recovery means so as to be enabled at least in part by said code frame sync recovery means strobe signal whereby a frame of code is capable of being propagated from said first latch means through said second latch means and onto said output bus.

13. A decoder and comparator of claim 12 further including:

first error compare means for comparing at least a portion of said frame of code which is temporarily being stored in said code receiving means with a first set of parameters for compliance of said portion of frame of code with said first set of parameters and for outputting a signal in response to compliance with said first set of parameters, said frame of code propagated to said first latch means in response to said compliance of said portion of said frame of code in conjunction with said enabling of said first latch means by said strobe signal.

14. A decoder and comparator of claim 12 further including:

first error compare means for comparing at least a portion of said frame of code which is temporarily being stored in said code receiving means with a first set of parameters for compliance of said portion of said frame of code with said first set of parameters and for outputting a signal in response to compliance with said first set of parameters, said frame of code propagated to said first latch means in response to said compliance of said portion of said frame of code in conjunction with said enabling of said first latch means by said strobe signal;

second error compare means for comparing at least a further portion of said frame of code which is located on said first latch means with a further set of parameters for compliance of said further portion of said frame of code with said further set of parameters and for outputting a signal in response to compliance with said further set of parameters, said frame of code propagated through said second latch means to said output bus in response to said compliance of said portion of said frame of code in conjunction with said enabling of said second latch means by said strobe signal.

15. A decoder and comparator for a biphase code comprising code storage means for receiving a stream of said code and temporarily storing a frame of said code, clock recovery means for receiving a stream of said code and recovering clock pulses from said code, said clock recovery means outputting a train of clock pulses to said code storage means for loading said frame of said code into said storage means, code frame recovery means for receiving a stream of said code and for recognizing a frame indicator in said code, said code frame recovery means outputting at least one strobe signal to said code storage means for outputting a stored frame of code from said code storage means in response to recognition of said frame indicator, and means for transmitting to each of said code storage means, said clock recovery means and said code frame recovery means duplicate but independent copies of said stream of code whereby said stream of code received by any of said code storage means, said clock recovery means or said code frame recovery means is not adulterated by others of said code storage means, said clock recovery means, or said code frame recovery means.

16. A decoder and comparator for a biphase code comprising
code storage means for receiving a stream of said code and temporarily storing a frame of said code,
clock recovery means for receiving a stream of said code and recovering clock pulses from said code, said clock recovery means outputting a train of clock pulses to said code storage means for loading said frame of said code into said storage means,
code frame recovery means for receiving a stream of said code and for recognizing a frame indicator in said code, said code frame recovery means outputting at least one strobe signal to said code storage means for outputting a stored frame of code from said code storage means in response to recognition of said frame indicator,
said storage means including first latch means for temporarily holding a frame of code in said code storage means, said first latch means operatively associated with said code frame recovery means so as to be enabled in part by said code frame recovery means strobe signal, and
second latch means for temporarily storing a frame of said code, said second latch means operatively connected to said first latch means to receive a frame of said code from said first latch means.

17. The decoder and comparator of claim 16 further including:
first enable means for controlling said first latch means;
said first enable means receiving an input strobe signal from at least said code frame recovery means so as to control said first latch means in response to at least said strobe signal from said code frame recovery means;
further enable means for controlling said second latch means;
said further enable means receiving an input strobe signal from at least said code frame recovery means so as to control said second latch means in response to at least said strobe signal from said code frame recovery means.

18. The decoder and comparator of claim 17 wherein:
said code frame recovery means sequentially outputting two strobe signals sequentially in time in response to recognition of said frame indicator in said code;
a first of said strobe signals outputted to said first enable means and the second of said strobe signals outputted to said further enable means at a subsequent time whereby said first latch and said second latch are capable of being sequentially enabled with said first latch enabled prior to said second latch.

19. The decoder and comparator of claim 16 further including;
error comparing means for comparing at least a portion of a frame of said code which is temporarily being stored in said first latch means with a set of parameters for compliance of said portion of said frame of code with said set of parameters and for outputting a signal in response to compliance with said parameters.

20. The decoder and comparator of claim 19 further including:
enable means for controlling said second latch means;
said enable means receiving an input signal from at least said error comparing means so as to control said second latch means in response to at least said input signal from said error comparing means.

21. The decoder and comparator of claim 19 further including:
enable means for controlling said second latch means;
said enable means receiving an input strobe signal from at least said code frame recovery means so as to control said second latch means in response to at least said strobe signal from said code frame recovery means.

22. The decoder and comparator of claim 19 further including:
enable means for controlling said second latch means, said enable means operatively connected between said second latch means and both of said code frame recovery, means and said error comparing means for receiving strobe signals from said code frame recovery means and for receiving output signals from said error comparing means to control said second latch means in response to said received code frame recovery strobe signals and said error comparing output signals.

23. The decoder and comparator of claim 22 wherein:
said enable means enables said second latch means in response to simultaneously receipt of a strobe signal from said code frame recovery means and an output signal from said error comparing means.

24. The decoder and comparator of claim 19 including:
error indicator means for outputting an indication of compliance of said portion of said code with said set of parameters.

25. The decoder and comparator of claim 16 wherein:
said code storage means further includes a code receiving means for receiving said stream of code and initially storing a frame of said code;
said clock recovery means outputting said train of clock pulse to said code receiving means for stepwise loading individual bits of a frame of said code into said code receiving means.

26. The decoder and comparator of claim 25 wherein:
said first latch means is operatively connected to said code receiving means whereby output of said code receiving means is inputted to said first latch means.

27. The decoder and comparator of claim 26 wherein:
said second latch means is operatively connected to said first latch means whereby output of said first latch means is inputted to said second latch means.

* * * * *